Figure 1:
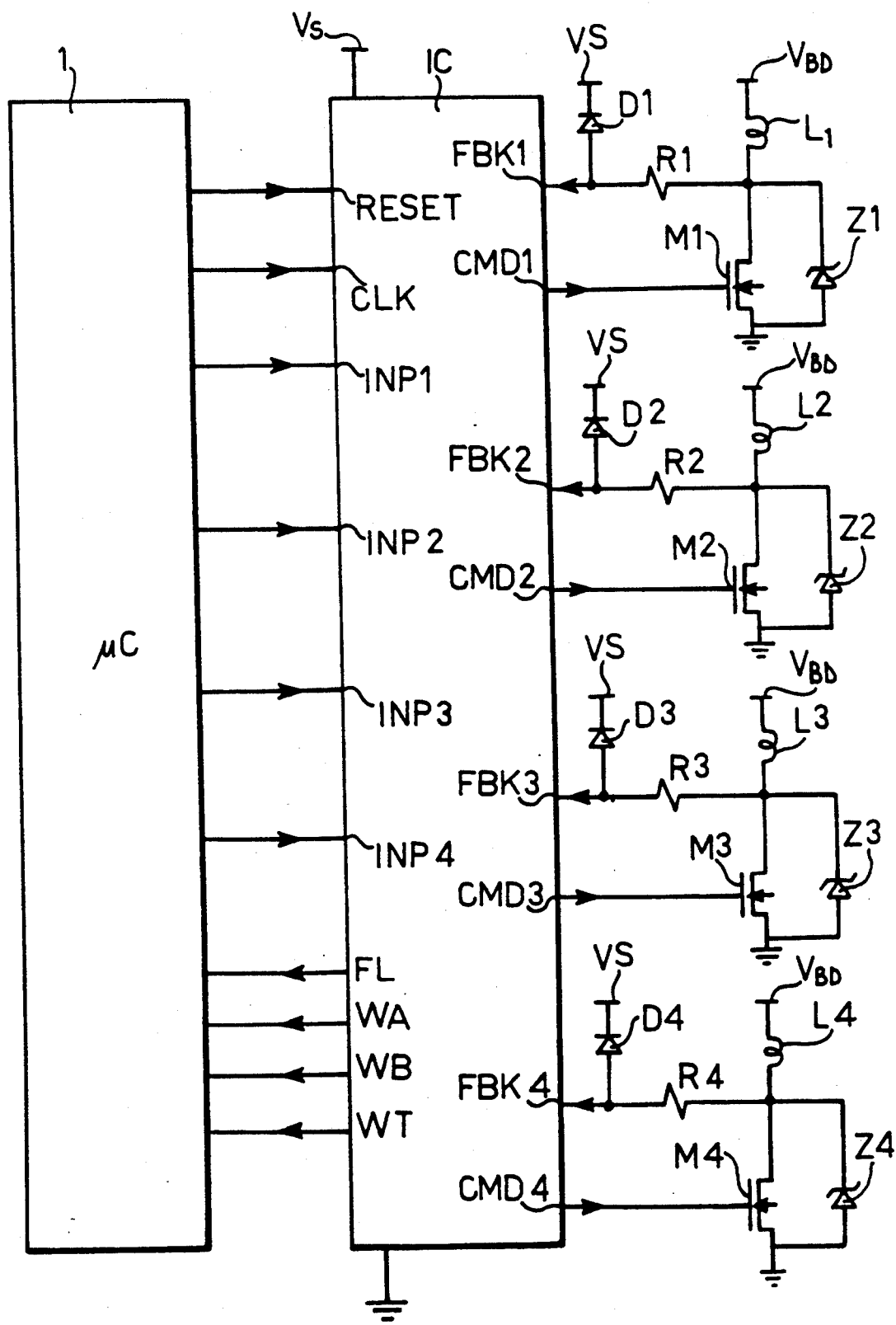

United States Patent [19]

Giorgetta et al.

[11] Patent Number: 5,195,011
[45] Date of Patent: Mar. 16, 1993

[54] CIRCUIT FOR INTERFACING BETWEEN A MICROPROCESSOR AND A PLURALITY OF POWER STAGES, PARTICULARLY FOR CONTROLLING ELECTRO-INJECTORS

[75] Inventors: Valerio Giorgetta; Yves LeGrand, both of Turin; Franco Salerno, Alpignano; Gianluigi Morello, Turin, all of Italy

[73] Assignee: Marelli Autronica SpA, Milan, Italy

[21] Appl. No.: 609,846

[22] Filed: Nov. 7, 1990

[30] Foreign Application Priority Data

Nov. 7, 1989 [IT] Italy .............................. 67969 A/89

[51] Int. Cl.⁵ .......................................... H02H 3/14
[52] U.S. Cl. .................................... 361/87; 361/154; 123/479
[58] Field of Search ................ 361/42, 86, 87, 111, 361/94, 93, 154; 123/480, 479, 490

[56] References Cited

U.S. PATENT DOCUMENTS

| | | | |
|---|---|---|---|
| 4,736,267 | 4/1988 | Karlmann et al. | 361/93 |
| 4,932,246 | 6/1990 | Deutsch et al. | 73/119 A |
| 4,992,836 | 2/1991 | Sicard | 361/111 |
| 5,127,388 | 7/1992 | Cicalese et al. | 123/692 |

*Primary Examiner*—Todd E. DeBoer
*Attorney, Agent, or Firm*—Sughrue, Mion, Zinn, Macpeak & Seas

[57] ABSTRACT

The interface circuit described comprises a plurality of control stages, each of which can detect and indicate a short-circuit in the corresponding load or the associated power transistor.

In particular, the interface circuit is arranged to disable a transistor permanently when short-circuits occur repeatedly in the load in order to prevent damage to the transistor.

5 Claims, 3 Drawing Sheets

CIRCUIT FOR INTERFACING BETWEEN A MICROPROCESSOR AND A PLURALITY OF POWER STAGES, PARTICULARLY FOR CONTROLLING ELECTRO-INJECTORS

DESCRIPTION

The present invention relates to a circuit for interfacing between a microprocessor and a plurality of power transistors, particularly "logic level" MOS POWER transistors, for controlling a corresponding plurality of loads, particularly electro-injectors of an internal combustion engine, each of which is connected to the drain-source path of one of the transistors, between the positive and negative terminals of a direct-current voltage supply.

Known interface circuits of this type are adapted to detect (and to signal to the microprocessor) whether each individual load is actually connected to its power transistor. These prior circuits cannot, however, prevent damage to the power transistors associated with the loads, particularly should one or more loads accidentally be short-circuited.

In order to prevent this problem, the invention therefore provides an interface circuit of the aforesaid type, whose main characteristic lies in the fact that it includes a plurality of control stages each of which is associated with one of the transistors and comprises

- a first input terminal for receiving a control logic signal from the microprocessor,
- a first output terminal for connection to the gate of the associated power transistor,
- a second input terminal for connection to the connection between the transistor and the load,
- a control circuit connected between the first input terminal and the first output terminal and adapted to make the transistor conductive when an enabling signal is present at its enabling input and the control logic signal is applied to the first input terminal, and
- a diagnostic logic circuit connected to the first and second input terminals and to the enabling input of the driver circuit; the diagnostic circuit being arranged
  - to detect a short-circuit between the drain of the transistor and the positive terminal of the voltage supply;
  - to apply a disabling signal to the control circuit for a period of temporary disablement when a first short-circuit condition occurs between the drain of the transistor and the positive terminal of the supply; and
  - to output a first breakdown signal and to apply a permanent disablement signal to the control circuit when a short-circuit condition is again detected between the drain of the transistor and the positive terminal of the supply after the temporary disablement period has elapsed.

Conveniently, each control stage includes its own delay circuit arranged to delay the activation of the diagnostic circuit for a predetermined minimum period of time after the receipt of the control logic signal.

The diagnostic logic circuit in each control stage may also conveniently be arranged to detect the occurrence of a short circuit between the drain of the associated power transistor and the negative terminal of the voltage supply and, correspondingly, to output a second breakdown signal.

According to a further characteristic, the interface circuit of the invention may to advantage include a single diagnosis-indication logic circuit connected to the outputs of the diagnostic circuits of the individual control stages and arranged to output digital information signals for identifying the stage corresponding to the power transistor short-circuited at the time and for determining whether the short-circuit is to the positive terminal or to the negative terminal of the voltage supply.

The diagnosis-indication circuit is conveniently of the resettable type and is arranged to indicate permanently only the first breakdown (short-circuit) which occurs after the last reset.

Figure 2:
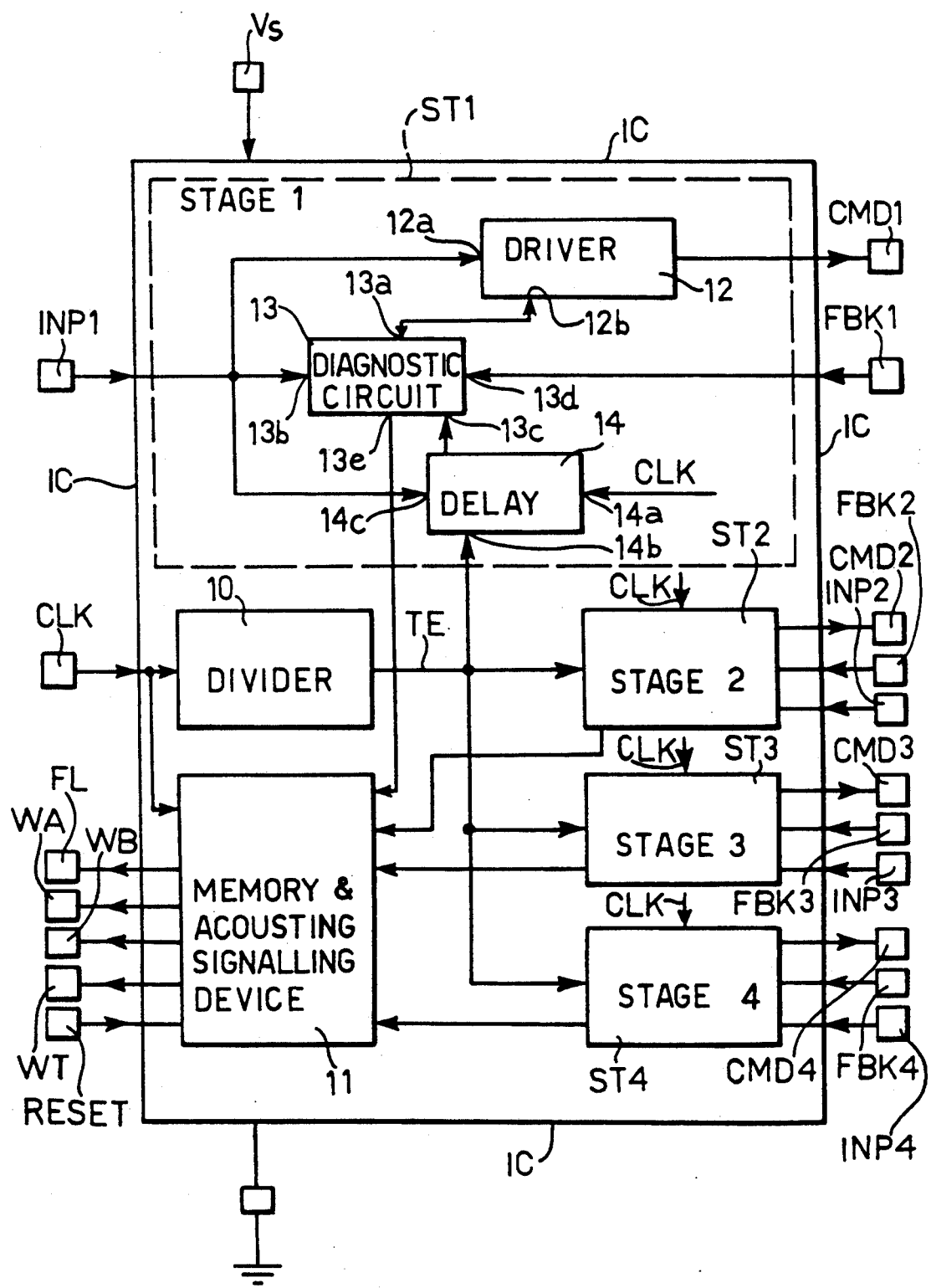
Figure 3:
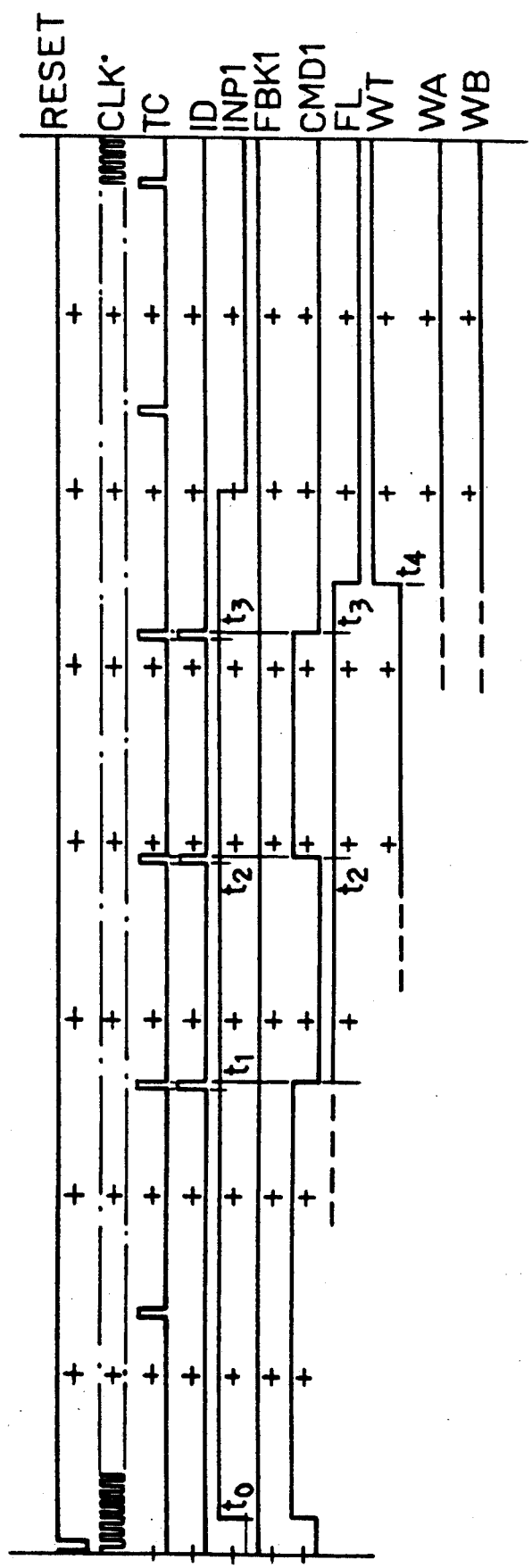

Further characteristics and advantages of the invention will become clear from the detailed description which follows, with reference to the appended drawings, provided purely by way of non-limiting example, in which:

FIG. 1 is an electrical diagram, partially in block form, showing circuit according to the invention for interfacing between a microprocessor and a plurality of transistor power circuits for driving corresponding loads, FIG. 2 is a block diagram showing the internal structure of an interface circuit according to the invention, and FIG. 3 is a series of graphs showing, by way of example, the behaviour of some signals applied to, or generated by, the interface circuit according to the invention in operation.

In FIG. 1, a microprocessor of known type is generally indicated 1 and controls four power transistors M1–M4 which are, for example, "Logic level" MOS POWER transistors. Respective loads L1–L4 are connected in series with the drain-source paths of the transistors and, in the embodiment illustrated, are inductive. These loads may be constituted by the electro-injectors of a motor-vehicle internal combustion engine.

Each load Li, with its associated transistor Mi, is arranged between the positive and negative terminals of a direct-current voltage supply $V_{BD}$ (whose negative terminal is connected to earth).

An associated current feedback Zener diode Zi is connected in parallel with the drain-source path of each power transistor Mi.

The gates of the transistors M1–M4 are connected in order to corresponding outputs CMD1–CMD4 of an integrated interface circuit, generally indicated IC, interposed between the microprocessor 1 and the transistors.

The drains of the transistors M1–M4, however, are connected in order to corresponding inputs FBK1–FBK4 of the interface circuit IC through resistors R1–R4.

Protective diodes, indicated D1–D4, are connected between the inputs FBK1–FBK4 of IC and the positive terminal of a direct-current voltage supply $V_S$. The function of these diodes is to protect the interface circuit IC from overvoltages, particularly when the voltage between the drains of the associated transistors M1–M4 and earth must exceed a predetermined value.

The interface circuit IC has four input terminals INP-1–INP4 each of which is connected to corresponding outputs of the microprocessor 1 and each is intended to receive a control logic signal for activating (that is for making conductive) the corresponding power transistor M1-M4.

An input of IC, indicated RESET, is connected to a corresponding output of the microprocessor 1 for receiving a reset signal for the reasons which will be explained below.

Reference CLK indicates a further input of IC to which the microprocessor 1 applies a clock signal at a frequency, for example, of 5 MHz.

Four further outputs of the interface circuit IC, indicated FL, WA, WB and WT, are connected to corresponding inputs of the microprocessor 1. As will become clearer from the following, these outputs of IC enable diagnosis-information signals, relating to the short-circuiting of a load or of one of the power transistors, to be transmitted to the microprocessor 1.

With reference to FIG. 2, the interface circuit IC includes four stages ST1-ST4, associated in order with the transistors M1-M4 and their loads L1-L4.

As well as the four stages ST1-ST4, the interface circuit IC includes a single divider circuit 10 which divides the frequency of the clock signal applied to the input CLK by a predetermined number (for example by 32) and supplies corresponding pulsed signals TC to each of the stages ST1-ST4.

Finally, the interface circuit IC includes a diagnosis-indication and memory circuit 11, whose functions will be described below. This circuit has an input connected to the terminal CLK, a plurality of inputs connected in order to the stages ST1-ST4, a further input connected to the RESET terminal, and four outputs connected to the terminals FL, WA, WB and WT.

The internal structures of the four stages ST1-ST4 are identical and will now be described with reference to FIG. 2 which shows solely the structure of the stage ST1 in detail.

Each of the stages includes a transistorised piloting (driver) circuit 12 with an input 10a connected to the terminal INPi (INP1 for the stage ST1) and an enabling-/disabling input 12b connected to an output 13a of a diagnostic logic circuit 13. The latter has three further inputs 13b, 13c, 13d, connected in order to the terminals INPi and FBKi and to the output of a delay circuit 14.

The diagnostic circuit 13 of each stage has an output 13e connected to the diagnosis-indication and memory circuit 11.

The delay circuit 14, which is constituted essentially by a counter, has three inputs 14a, 14b and 14c connected in order to the terminal CLK, to the output of the divider 10 and to the input terminal INPi.

The operation of the interface circuit IC will now be described with reference to the operation of a single stage, in particular the stage ST1. This operation will be described with reference to FIG. 3 which shows, by way of example, the behaviour of eleven signals applied to, or generated by, the interface circuit.

In particular, the RESET, CLK, INP1 and FBK1 signals are the signals applied to, or detected at, the similarly-named terminals of the interface circuit. The signals CMD1, FL, WA, WB and WT are the signals output by the interface circuits in correspondence with the similarly-named inputs. The signals TC and TD, however, are the signals output by the divider circuit 10 and a delay circuit 14 respectively.

In operation, in order to activate (for example) the load L1, the microprocessor 1 applies to the input INP1 of the interface circuit IC, a signal which changes from level "0" to level "1", as shown, for example, at the time $t_1$ in FIG. 3. This signal is fed to the input of the driver circuit 12 of the stage ST1 which causes the appearance of a signal at the output of CMD1 which also changes from level "0" to level "1", making the transistor M1 conductive. A current thus passes through the load L1. As well as reaching the driver circuit 12, the control signal applied to the input INP1 is also fed to the delay circuit 14 and to the diagnostic logic circuit 13. The delay circuit disables the diagnostic circuit for a predetermined time interval (that is, up to the time $t_1$ of FIG. 3) so that, during this delay interval, the diagnostic circuit cannot prevent the driver circuit 12 from operating.

Provided no accidental short-circuit arises between the drain of the transistor M1 and the positive or negative terminal of the voltage supply $V_{BD}$, a signal at logic level "0" is present at the terminal FBK1 of the interface circuit IC as long as M1 is conductive.

When the delay interval set by the circuit 14 has elapsed, the diagnostic circuit compares the signals applied to its inputs 13b and 13d; if each of these is the logic complement of the other, this indicates that the transistor M1 and its load are operating correctly. If, however, whilst the signal at the terminal INP1 is at level "1", the signal applied to the terminal FBK1 is also at level "1", as shown in FIG. 3, this means that the drain of the transistor M1 is short-circuited to the positive terminal of the voltage supply $V_{BD}$ (short-circuit in the load). When this short-circuit condition is detected, the diagnostic circuit 13 applies a disabling signal to the input 12b of the driver circuit 12 so that the signal output to the terminal CMD1 returns to level "0", as indicated at the time $t_1$ of FIG. 3. The transistor M1 is consequently cut off.

As soon as the delay circuit 14 applies a further pulse to the input 13c of the diagnostic circuit 13 (time $t_2$ in FIG. 3), the diagnostic circuit 13 again applies an enabling signal to the enabling input 12b of the driver circuit 12. Shortly after the time $t_2$, therefore, the signal at the terminal CMD1 returns to level "1", provided, of course, that the signal INP1 continues to remain at level "1" as in the case of FIG. 3. The transistor M1 is then made conductive again. If, under these conditions, the diagnostic circuit 13 detects that the signal present at the input FBK1 is the logic complement of the signal applied to the terminal INP1, then this means that the previous short-circuit condition has disappeared, that is, it was a momentary, accidental short-circuit. If, however, despite INP1 being at level "1", the signal FBK1 is still at level "1", as in FIG. 3, at a subsequent time $t_3$ (corresponding to the emission of a new pulse by the delay circuit 14 to the diagnostic circuit), the diagnostic circuit 13 permanently, that is finally, disables the driver circuit 12 so that the signal at the terminal CMD1 returns to, and is kept at, level "0", preventing further stressing of the transistor M1 and thus preventing it from being damaged.

After the driver circuit 12 has been disabled permanently, the diagnostic circuit 13 transmits to the diagnosis-indication and memory circuit a signal indicative of the fact that a situation has been detected in which the transistor M1 is short-circuited to the load. The diagnosis-indication and memory circuit supplies a breakdown signal to the microprocessor 1, for example by making the output FL change from level "1" to level "0", as shown at the time $t_4$ in FIG. 3. As well as this indication, the diagnostic indication and memory circuit indicates to the microprocessor 1 in which stage the breakdown has occurred: this information is transmitted by means of the two bits corresponding to the outputs WA and WB. In the example of FIG. 3, when both of the outputs WA and WB are at level "0", this means that the breakdown indicated is concerned with the transistor associated with the stage ST1.

A further piece of information which is passed to the microprocessor 1 by the circuit 11 is the nature of the short-circuit detected: if the short-circuit detected is to the positive terminal of the supply $V_{BD}$, the output WT of the circuit 11 changes to level "1", whilst it remains at level "0" if the short-circuit detected is to earth. In effect, as will now be described, each stage STi can also detect and indicate a short-circuit between the drain of the associated transistor Mi and earth. Clearly, however, this short-circuit could be confused with normal operation, that is, with the condition in which current is flowing in the load Li. The diagnostic circuit 13 of each stage is therefore arranged to "observe" the signal FBKi only immediately after a signal has been applied to the associated transistor Mi to make it conductive. If, during the change to conduction, the signal FBKi is at level "0" instead of at level "1", this indicates a short-circuit to earth (or that the load Li is disconnected from Mi). This type of short-circuit is not, however, so dangerous as regards the transistor near which it occurs. In this situation, therefore, the diagnostic circuit indicates the condition solely to the diagnosis-indication and memory circuit. The latter in turn informs the microprocessor 1: that the breakdown has occurred (FL=1), of the stage associated with the transistor near which the short-circuit has occurred (data provided at the outputs WA and WB), and of the nature of the short-circuit (short-circuit to earth: WT=0).

Conveniently, the diagnosis-indication and memory circuit is arranged to indicate permanently to the microprocessor 1 only the first breakdown indicated to it by one of the stages of the interface circuit after the last resetting of the circuit 11. In other words, when a first breakdown occurs, the circuit 11 indicates to the microprocessor 1 the breakdown, as well as the position and nature of the breakdown, but does not then indicate any breakdowns which occur subsequently.

As stated above, the driver circuit 12 can be formed in known manner with the use of transistors.

The diagnostic circuit can be formed with bistable circuits (flip-flops) on the basis of the foregoing description and the following truth table which defines their behaviour:

TRUTH TABLE
(Diagnostic Circuit 13)

| t | TD | INPI | FBKi | EN-ABLE | CMDi | Significance |
|---|----|----|----|----|----|----|
|  | 0 | X | X | 1 | X | Circuit 13 disabled Circuit 12 enabled |
|  | 1 | X | INPI | 1 | X | All OK |
|  | 1 | 0 | 0 | 1 | 0 | Short-circuit to earth Circuit 12 remains enabled |
| t1 | 1 | 1 | 1 | 0 | 0 | Short-circuit to +$V_{BD}$ Driver circuit 12 temporarily disabled |
| t2 | 1 | 1 | X | 1 | 1 | Driver circuit 12 re-enabled |
| t3 | 1 | 1 | 0 | 1 | 1 | All OK again |
| t3 | 1 | 1 | 1 | 0 | 0 | permanent s.c. to $V_{BD}$ |

-continued
TRUTH TABLE
(Diagnostic Circuit 13)

| t | TD | INPI | FBKi | EN-ABLE | CMDi | Significance |
|---|----|----|----|----|----|----|
| t4 | X | X | X | 0 | 0 | Circuit 12 disabled permanently Driver circuit remains finally disabled |

In the preceding table, ENABLE indicates the signal output by the diagnostic circuit 13 at the output 13a for the enabling input 12b of the driver circuit 12.

In the table given above the column CMDi has been added to show the states assumed correspondingly by the signal supplied by the driver circuit 12 to the associated transistor.

Finally, in the preceding table, the times $t_1$, $t_2$ and $t_3$ correspond to the times indicated by the same symbols in FIG. 3.

The diagnosis-indication and memory circuit 11 may be formed with the use of logic circuits, particularly bistable circuits.

With reference to the embodiment described above, the truth table of the outputs of the circuit 11 is as follows:

TRUTH TABLE
(Diagnostic indication circuit 11)

| FL | WT | WA | WB | Significance |
|----|----|----|----|----|
| 1 | X | X | X | OK |
| 0 | 0 | 0 | 0 | s.c. to − $V_{DB}$ in transistor associated with ST1 |
| 0 | 0 | 1 | 0 | s.c. to − $V_{BD}$/ST2 |
| 0 | 0 | 1 | 1 | s.c. to − $V_{BD}$/ST3 |
| 0 | 0 | 0 | 1 | s.c. to − $V_{BD}$/ST4 |
| 0 | 1 | 0 | 0 | s.c. to + $V_{BD}$/ST1 |
| 0 | 1 | 1 | 0 | s.c. to + $V_{BD}$/ST2 |
| 0 | 1 | 1 | 1 | s.c. to + $V_{BD}$/ST3 |
| 0 | 1 | 0 | 1 | s.c. to + $V_{BD}$/ST4 |

As pointed out, the interface circuit described above can conveniently be produced in the form of an integrated circuit on a single chip. The circuit can be arranged, by known techniques, so that it can be tested by the application to its inputs of coded signals corresponding to a configuration which cannot occur under normal operating conditions.

We claim:

1. A circuit for interfacing between a microprocessor and a plurality of transistors, particularly MOSFET power transistors for driving a corresponding plurality of loads, particularly electrical injectors, each of which is connected to the drain-source path of one of the transistors through a feedback terminal and between the positive and negative terminals of a direct-current voltage supply; the circuit including a plurality of control stages each of which is associated with one of the transistors and comprises a first input terminal for receiving a control logic signal, a first output terminal for connection to the gate of the associated power transistor, a driver circuit, connected between the first input terminal and the first output terminal and adapted to make the transistor conductive when an enabling signal is present at its enabling input and the control logic signal is applied to the first input terminal, and a diagnostic logic circuit, connected to said first terminal and said feedback terminal and to the enabling input of the driver circuit the diagnostic circuit being arranged to detect a short-circuit condition between the drain of the transistor and the positive terminal of the voltage supply;

to apply a disabling signal to the control circuit for a period of temporary disablement when a first short-circuit condition occurs between the drain of the transistor and the positive terminal of the supply;

to output a first breakdown signal and to apply a permanent disablement signal to the control circuit when a short-circuit condition is again detected between the drain of the transistor and the positive terminal of the supply after the temporary disablement period has elapsed.

2. A circuit according to claim wherein each control stage includes its own delay circuit connected to the first input and to the diagnostic circuit and arranged to delay the activation of the diagnostic circuit for a predetermined minimum period of time after the control logic signal.

3. A circuit according to claim 1, wherein in each control stage the diagnostic logic circuit is also arranged to detect a short-circuit condition between the drain of the associated power transistor and the negative terminal of the supply and/or the disconnection of the load from the associated transistor on the basis of a comparison of the signals present at the first and second inputs and to output a corresponding second breakdown signal.

4. A circuit according to claim 3, including a single diagnosis-indication logic circuit connected to the outputs of the diagnostic circuits of the individual control stages; the diagnosis-indication circuit being arranged to output digital information signals for identifying the stage corresponding to the power transistor in which the short-circuit has occurred, and for determining whether the short-circuit is to the positive terminal or to the negative terminal of the voltage supply.

5. A circuit according to claim 4, wherein the diagnosis-indication circuit is resettable and is arranged to indicate permanently only the first breakdown which occurs after the last reset.

* * * * *